United States Patent
Bisplinghoff et al.

(10) Patent No.: US 10,078,540 B2
(45) Date of Patent: Sep. 18, 2018

(54) ACCURATE AND FAST IN-SERVICE ESTIMATION OF INPUT BIT ERROR RATIO OF LOW DENSITY PARITY CHECK DECODERS

(71) Applicant: Cisco Technology, Inc., San Jose, CA (US)

(72) Inventors: Andreas Bisplinghoff, Forchheim (DE); Stefan Langenbach, Lauf (DE)

(73) Assignee: Cisco Technology, Inc., San Jose, CA (US)

( * ) Notice: Subject to any disclaimer, the term of this patent is extended or adjusted under 35 U.S.C. 154(b) by 626 days.

(21) Appl. No.: 14/304,147

(22) Filed: Jun. 13, 2014

(65) Prior Publication Data
US 2015/0363247 A1    Dec. 17, 2015

(51) Int. Cl.
*H03M 13/00*   (2006.01)
*G06F 11/07*   (2006.01)
*H03M 13/11*   (2006.01)

(52) U.S. Cl.
CPC ....... *G06F 11/076* (2013.01); *H03M 13/1105* (2013.01); *H03M 13/612* (2013.01)

(58) Field of Classification Search
CPC ........ G06F 11/00; G06F 11/076; G06F 11/10; H03M 13/1137; H03M 13/036; H03M 13/05; H03M 13/11; H03M 13/1105; H03M 13/1111; H03M 13/116; H03M 13/1165; H03M 13/255; H03M 13/612; H03M 13/616; H04L 1/0041; H04L 1/0057
See application file for complete search history.

(56) References Cited

U.S. PATENT DOCUMENTS

| | | | |
|---|---|---|---|
| 7,991,070 B2 | 8/2011 | Batshon et al. | |
| 8,181,091 B2 | 5/2012 | Djordjevic et al. | |
| 8,219,874 B2 | 7/2012 | Djordjevic et al. | |
| 8,270,506 B2 | 9/2012 | Rog et al. | |
| 8,291,283 B1 * | 10/2012 | Rad | H03M 13/036 714/752 |
| 8,291,292 B1 * | 10/2012 | Varnica | H03M 13/1114 714/758 |
| 8,291,304 B2 | 10/2012 | Yoshida et al. | |

(Continued)

FOREIGN PATENT DOCUMENTS

EP    2161840 A2 *    3/2010    ......... H03M 13/1111

OTHER PUBLICATIONS

Lechner, G., et al. "Estimating Channel Parameters from the syndrome of a Linear Code", IEEE Communications Letters, Nov. 2013, pp. 2148-2151, vol. 17, No. 11.*

(Continued)

*Primary Examiner* — Albert Decady
*Assistant Examiner* — Enamul M Kabir
(74) *Attorney, Agent, or Firm* — Edell, Shapiro & Finnan, LLC

(57) ABSTRACT

A device receives signals over a communication medium and uses a low density parity check decoder to decode data in the signals. A number of unsatisfied parity checks are counted prior to a first decoding iteration of the low density parity check decoder on a basis of log likelihood ratios computed from the signals. An operational characteristic of the low density parity check decoder is computed based on an accumulated number of unsatisfied parity checks.

18 Claims, 9 Drawing Sheets

(56) References Cited

U.S. PATENT DOCUMENTS

| | | | |
|---|---|---|---|
| 8,385,439 B2 | 2/2013 | Djordjevic et al. | |
| 8,578,238 B2 | 11/2013 | Priewasser et al. | |
| 8,732,564 B2 | 5/2014 | Chinnici et al. | |
| 9,092,350 B1* | 7/2015 | Jeon | G06F 11/004 |
| 2002/0108090 A1 | 8/2002 | Ariel et al. | |
| 2003/0072392 A1* | 4/2003 | Beadle | H04B 17/336 |
| | | | 375/316 |
| 2005/0005189 A1* | 1/2005 | Khermosh | H04L 1/0057 |
| | | | 714/4.1 |
| 2005/0229087 A1 | 10/2005 | Kim et al. | |
| 2007/0177475 A1 | 8/2007 | Kim et al. | |
| 2008/0008257 A1* | 1/2008 | Yonesi | H03M 13/1102 |
| | | | 375/262 |
| 2009/0003476 A1 | 1/2009 | Rog et al. | |
| 2009/0052907 A1 | 2/2009 | Batshon et al. | |
| 2009/0292967 A1* | 11/2009 | Sasaki | B23B 5/166 |
| | | | 714/752 |
| 2009/0297144 A1 | 12/2009 | Djordjevic et al. | |
| 2010/0088571 A1 | 4/2010 | Djordjevic et al. | |
| 2010/0192043 A1* | 7/2010 | Alrod | H03M 13/1111 |
| | | | 714/763 |
| 2010/0211849 A1 | 8/2010 | Djordjevic et al. | |
| 2010/0268918 A1 | 10/2010 | Priewasser et al. | |
| 2011/0252286 A1* | 10/2011 | Li | H03M 13/1114 |
| | | | 714/755 |
| 2011/0264983 A1 | 10/2011 | Yoshida et al. | |
| 2011/0293045 A1 | 12/2011 | Gross et al. | |
| 2012/0030541 A1 | 2/2012 | Okamura | |
| 2012/0141135 A1 | 6/2012 | Yang et al. | |
| 2012/0221914 A1* | 8/2012 | Morero | H03M 13/015 |
| | | | 714/752 |
| 2012/0297267 A1* | 11/2012 | Chinnici | H03M 13/1111 |
| | | | 714/755 |
| 2013/0216221 A1 | 8/2013 | Zhang et al. | |
| 2014/0053037 A1* | 2/2014 | Wang | H03M 13/13 |
| | | | 714/752 |
| 2014/0068368 A1* | 3/2014 | Zhang | H03M 13/658 |
| | | | 714/752 |
| 2014/0143637 A1* | 5/2014 | Cohen | H03M 13/1108 |
| | | | 714/773 |
| 2014/0281823 A1* | 9/2014 | Micheloni | G06F 11/1012 |
| | | | 714/773 |
| 2014/0310573 A1* | 10/2014 | Mao | G06F 11/1068 |
| | | | 714/773 |
| 2015/0128006 A1* | 5/2015 | Alhussien | G06F 11/1068 |
| | | | 714/758 |
| 2015/0149855 A1* | 5/2015 | Alhussien | G06F 11/1012 |
| | | | 714/758 |
| 2015/0331748 A1* | 11/2015 | Cohen | G06F 11/1076 |
| | | | 714/764 |

OTHER PUBLICATIONS

Adjudeanu, et al., "On the correlation between error weights and syndrome weights for belief propagation decoding of LDPC codes," 11th Canadian Workshop on Information Theory, 2009 (CWIT 2009), May 2009, pp. 36-41.

Gho, et al., "Rate-Adaptive Modulation and Low-Density Parity-Check Coding for Optical Fiber Transmission Systems," IEEE/OSA Journal of Optical Communications and Networking, vol. 4, No. 10, Oct. 2012, pp. 760-768.

International Search Report and Written Opinion in counterpart International Application No. PCT/US2015/035272, dated Aug. 19, 2015, 14 pages.

G. Lechner, et al., "Estimating Channel Parameters from the Syndrome of a Linear Code", IEEE Communications Letters, IEEE Service Center, Piscataway, NJ, US, vol. 17, No. 11, Nov. 1, 2013, pp. 2148-2151, XP011532207, ISSN: 1089-7798.

* cited by examiner

FOR A GIVEN PROBABILITY p (SERVING AS ALIAS FOR BER), COMPUTE UCR OR UPB = UCR/BER BY AVERAGING MANY SYNDROME WEIGHT RESULTS OVER MANY RANDOM ERROR VECTORS THAT ARE GENERATED WITH ERROR PROBABILITY p IN A MONTE CARLO OR OTHER SIMULATION

| 502 | | 504 | 506 | 508 | | | |
|---|---|---|---|---|---|---|---|
| prob | ratio | (conversion factors) | | ratio | PROB | asymptotes | |
| sim in | derived | sim out | derived | derived | derived | derived | derived |
| p | BER | UPB | BPU | UCR | ucp | 3·p | ucp/3 |
| | | 1/BPU | 1/UPB | BER/BPU | UPB·BER | | |
| | | | | 1 | 1 | | 3.33E-01 |
| 9.99E-01 | 9.99E-01 | 0.002946 | 339.4352 | 2.94E-03 | 2.94E-03 | 3.00E+00 | 9.81E-04 |
| 9.00E-01 | 9.00E-01 | 0.08238 | 12.13894 | 7.41E-02 | 7.41E-02 | 2.70E+00 | 2.47E-02 |
| 5.00E-01 | 5.00E-01 | 0.150012 | 6.666133 | 7.50E-02 | 7.50E-02 | 1.50E+00 | 2.50E-02 |
| 4.00E-01 | 4.00E-01 | 0.187502 | 5.333276 | 7.50E-02 | 7.50E-02 | 1.20E+00 | 2.50E-02 |
| 3.00E-01 | 3.00E-01 | 0.25001 | 3.99968 | 7.50E-02 | 7.50E-02 | 9.00E-01 | 2.50E-02 |
| 2.00E-01 | 2.00E-01 | 0.375019 | 2.666532 | 7.50E-02 | 7.50E-02 | 6.00E-01 | 2.50E-02 |
| 1.50E-01 | 1.50E-01 | 0.499658 | 2.001369 | 7.49E-02 | 7.49E-02 | 4.50E-01 | 2.50E-02 |
| 1.20E-01 | 1.20E-01 | 0.622433 | 1.606599 | 7047E-02 | 7047E-02 | 3.60E-01 | 2.49E-02 |
| 1.00E-01 | 1.00E-01 | 0.741438 | 1.34873 | 7.41E-02 | 7.41E-02 | 3.00E-01 | 2.47E-02 |
| 8.00E-02 | 8.00E-02 | 0.90879 | 1.100364 | 7.27E-02 | 7.27E-02 | 2.40E-01 | 2.42E-02 |
| 6.00E-02 | 6.00E-02 | 1.15295 | 0.86734 | 6.92E-02 | 6.92E-02 | 1.80E-01 | 2.31E-02 |
| 4.00E-02 | 4.00E-02 | 1.52119 | 0.65738 | 6.08E-02 | 6.08E-02 | 1.20E-01 | 2.03E-02 |
| 3.00E-02 | 3.00E-02 | 1.77501 | 0.563377 | 5.33E-02 | 5.33E-02 | 9.00E-02 | 1.78E-02 |
| 2.00E-02 | 2.00E-02 | 2.09292 | 0.477801 | 4.19E-02 | 4.19E-02 | 6.00E-02 | 1.40E-02 |
| 1.00E-02 | 1.00E-02 | 2.49271 | 0.40117 | 2.49E-02 | 2.49E-02 | 3.00E-02 | 8.31E-03 |
| 8.00E-03 | 8.00E-03 | 2.58513 | 0.386828 | 2.07E-02 | 2.07E-02 | 2.40E-02 | 6.89E-03 |
| 6.00E-03 | 6.00E-03 | 2.68178 | 0.372887 | 1.61E-02 | 1.61E-02 | 1.80E-02 | 5.36E-03 |
| 5.00E-03 | 5.00E-03 | 2.73185 | 0.366052 | 1.37E-02 | 1.37E-02 | 1.50E-02 | 4.55E-03 |
| 3.00E-03 | 3.00E-03 | 2.83498 | 0.352736 | 8.50E-03 | 8.50E-03 | 9.00E-03 | 2.83E-03 |
| 2.00E-03 | 2.00E-03 | 2.88883 | 0.346161 | 5.78E-03 | 5.78E-03 | 6.00E-03 | 1.93E-03 |
| 1.00E-03 | 1.00E-03 | 2.94419 | 0.339652 | 2.94E-03 | 2.94E-03 | 3.00E-03 | 9.81E-04 |
| 8.00E-04 | 8.00E-04 | 2.95468 | 0.338446 | 2.36E-03 | 2.36E-03 | 2.40E-03 | 7.88E-04 |
| 5.00E-04 | 5.00E-04 | 2.97209 | 0.336464 | 1.49E-03 | 1.49E-03 | 1.50E-03 | 4.95E-04 |
| 4.00E-04 | 4.00E-04 | 2.9761 | 0.3360 | 1.19E-03 | 1.19E-03 | 1.20E-03 | 3.97E-04 |
| 2.00E-04 | 2.00E-04 | 2.98873 | 0.33459 | 5.98E-04 | 5.98E-04 | 6.00E-04 | 1.99E-04 |
| 1.50E-04 | 1.50E-04 | 2.99423 | 0.333976 | 4.49E-04 | 4.49E-04 | 4.50E-04 | 1.50E-04 |
| 1.00E-04 | 1.00E-04 | 2.99409 | 0.333991 | 2.99E-04 | 2.99E-04 | 3.00E-04 | 9.98E-05 |
| 1.00E-05 | 1.00E-05 | 2.99962 | 0.333376 | 3.00E-05 | 3.00E-05 | 3.00E-05 | 1.00E-05 |
| 1.00E-06 | 1.00E-06 | 3 | 0.333333 | 3.00E-06 | 3.00E-06 | 3.00E-06 | 1.00E-06 |
| | | | | 1.00E-06 | 1.00E-06 | 0.00E+00 | 3.33E-07 |

FIG.5

DERIVE BPU AND UCR FROM UPB

900

910

AT A DEVICE THAT RECEIVES SIGNALS OVER A COMMUNICATION MEDIUM AND USES A LOW DENSITY PARITY CHECK DECODER TO DECODE DATA IN THE SIGNALS, COUNTING A NUMBER OF UNSATISFIED PARITY CHECKS PRIOR TO A FIRST DECODING ITERATION OF THE LOW DENSITY PARITY CHECK DECODER ON A BASIS OF LOG LIKELIHOOD RATIOS (OR EQUIVALENT SOFT INFORMATION) COMPUTED FROM THE SIGNALS

920

COMPUTING AN OPERATIONAL CHARACTERISTIC OF THE LOW DENSITY PARITY CHECK DECODER BASED ON THE ACCUMULATED NUMBER OF UNSATISFIED PARITY CHECKS

ACCURATE AND FAST IN-SERVICE ESTIMATION OF INPUT BIT ERROR RATIO OF LOW DENSITY PARITY CHECK DECODERS

TECHNICAL FIELD

The present disclosure relates to forward error correction decoding of signals received via a communication channel.

BACKGROUND

In communication systems and networks, error correction coding is often employed in order to increase the ability to recover the originally transmitted data in the presence of channel noise and related impairments. Forward error correction coding is one type of coding scheme that is commonly employed.

High speed data transmission systems such as dense wavelength division multiplexed (DWDM) interfaces employ coded transmissions with forward error correction (FEC). Both for performance management (e.g., alarming a signal degradation) and for reactive protection switching processes (e.g., signaling to fast reroute protocol engines), pre-FEC in-service signal quality indicators are useful.

BRIEF DESCRIPTION OF THE DRAWINGS

FIG. 5 is a diagram illustrating data generated from Monte Carlo simulations using the parity check matrix of a low density parity check code across a range of error probabilities for determining bit error ratio (alias error probability) versus unsatisfied parity check characteristics of the low density parity check code, according to an example embodiment.

FIG. 9 is a flow chart generally depicting operations performed in a receiver device to compute an operational characteristic of a low density parity check decoder based on an accumulated number of unsatisfied parity checks, according to an example embodiment.

DESCRIPTION OF EXAMPLE EMBODIMENTS

Overview

Briefly, in one example embodiment, a device receives signals over a communication medium and uses a low density parity check decoder to decode data in the signals. A number of unsatisfied parity checks are counted prior to a first decoding iteration of the low density parity check decoder on a basis of log likelihood ratios computed from the signals. An operational characteristic of the low density parity check decoder is computed based on the accumulated number of unsatisfied parity checks.

Example Embodiments

For modern iterative, compound (concatenated, interleaved, coupled) soft decision codecs, especially for low density parity check (LDPC) codes, accurate and fast methods for in-service pre-FEC bit error ratio (BER) measurement or estimation are useful. In coding schemes that are based on single parity check component codes, such as LDPC codes, a single bit error violates a known (average) number of parity checks. Another bit error doubles this number of violated checks. As long as the probability of a new bit error to hit a parity check that has already been hit remains small, the (average) number of violated checks will be proportional to the number of bit errors. When more bit errors occur, the number of unsatisfied checks per bit error decreases.

Overall, for each LDPC code there is a nonlinear conversion function (characteristic for the degree distribution of the code), which translates the number (or rate) of bit errors into a number (or rate) of unsatisfied parity checks (or vice versa). The conversion function is linear for low pre-FEC BER but becomes (strongly) nonlinear when approaching or exceeding the correction threshold.

Figure 1:
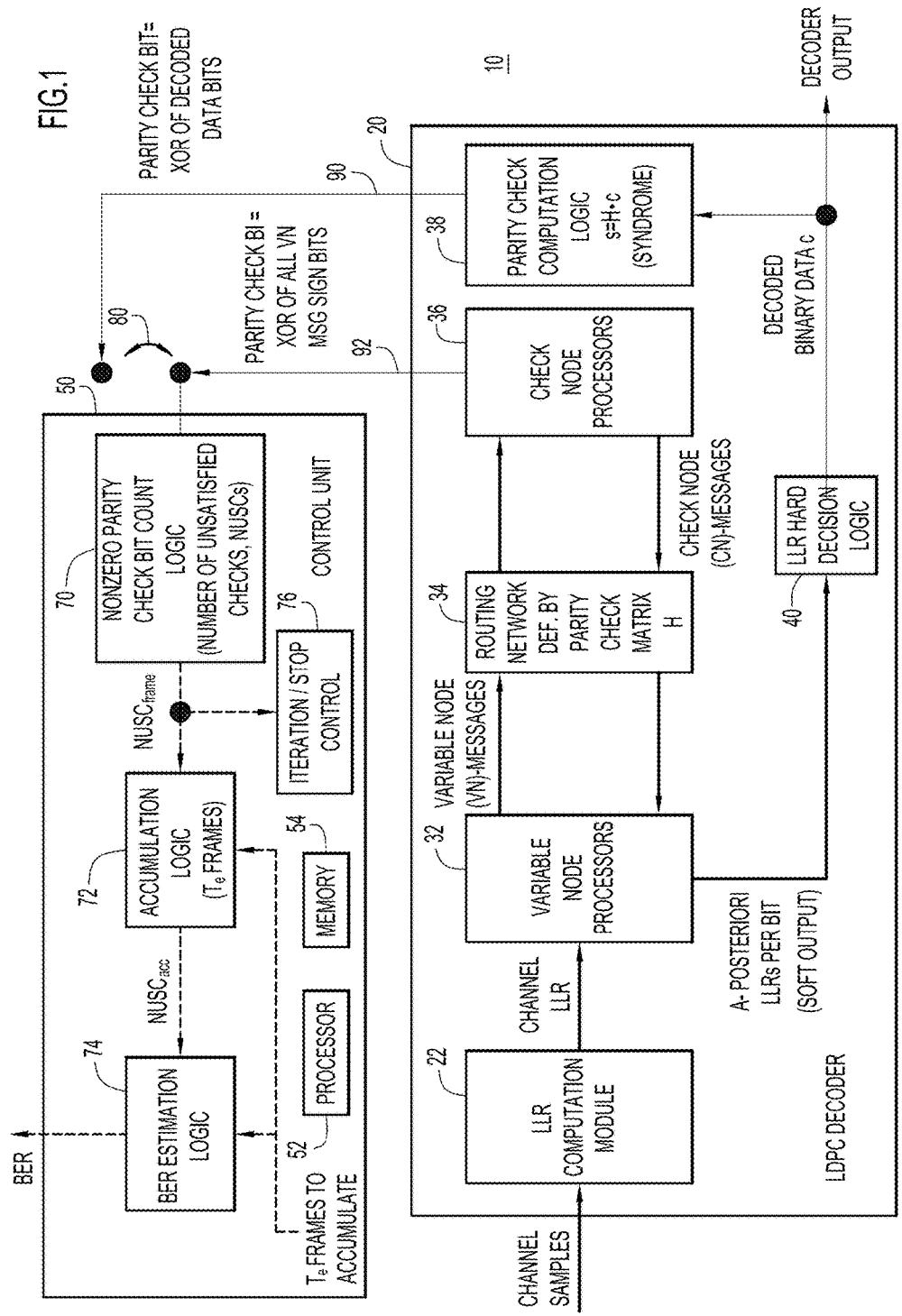
FIG. 1 is a block diagram of a receiver system having a low density parity check decoder and employing techniques to perform in-service estimation of operational characteristics of the low density parity check decoder, according to an example embodiment.

Reference is now made to FIG. 1. FIG. 1 shows the functional architecture of the decoder part of a receiver system 10 that includes an LDPC decoder 20 and a control unit 50. In FIG. 1, bold arrows are non-binary data (vectors), solid arrows are binary data (vectors) and dashed arrows are numeric (scalar). The LDPC decoder 20 includes a Log Likelihood Ratio (LLR) computation module 22, a variable node processors block 32, a routing network 34 defined by a parity check matrix H, a check node processors block 36, a parity check computation logic block 38 and an LLR hard decision logic block 40. The variable node processors block 32 includes a plurality of variable nodes and the check node processors block 36 includes a plurality of check nodes. These individual variable nodes and check nodes are not shown in FIG. 1 for simplicity. The parity check computation logic block 38 is coupled between the LLR hard decision logic 40 and the control unit 50.

The control unit 50 may include a processor 52 and memory 54. The memory 54 stores instructions that are executed by the processor 52. Specifically, the memory 54 stores instructions for nonzero parity check bit count logic 70, accumulation logic 72 and bit error ratio (BER) estimation logic 74. In addition, the memory 54 stores instructions for iteration/stop control logic 76. The individual bits of the syndrome, which are the results of computing the parity checks, are denoted parity check bits.

The system 10 shown in FIG. 1 may be implemented as digital logic gates in programmable or fixed form, such as in one or more Application Specific Integrated Circuits (ASICs) or digital signal processors. Alternatively, the system 10 may be implemented partially or entirely in software stored in memory 54 and executed by one or more processors. To this end, the memory 54 is any tangible processor readable storage media (i.e., non-transitory, such as a memory device) that stores instructions that, when executed by a processor, cause the processor to perform the operations described herein.

The objective of the BER estimation techniques presented herein is to compute BER in-service (during operation) while data transmission is occurring, without disturbing that transmission and without knowledge about the transmitted data payload.

Definitions and Terminology

The following are definitions of terms used in the foregoing description.
Counter Variables:
  NUSC: Number of unsatisfied parity checks in a certain time interval (generic term).
  $NUSC_{frame}$: Number of unsatisfied parity checks in a code word (frame). $NUSC_{frame}$ is also known as the syndrome weight.
  $NUSC_{acc}$: Number of unsatisfied parity checks per frame (alias syndrome weight) accumulated over a given number of frames.
Ratio Variables:
  BER: Number of bit errors (#errors) divided by the number of bits received (#bits): BER=#errors/#bits. It is a measurable observable quantity. In this context, BER is computed from UCR (in BER estimation) or given (when computing $NUSC_{acc}$ alert thresholds).
  UCR: Number of unsatisfied parity checks divided by bits received: UCR=NUSC/#bits. It is a measurable observable quantity. In this context, UCR is computed from BER (for alert threshold setting) or measured (for BER estimation).
Conversion Factors:
  UPB: Unsatisfied checks per bit error. This is a "conversion factor" from BER to UCR (or, equivalently, from bit error count to unsatisfied check count). UPB=UCR/BER=NUSC/#errors.
  BPU: Bit errors per unsatisfied check. This is a "conversion factor" from UCR to BER (or, equivalently, from unsatisfied check count to bit error count). BPU=BER/UCR=#errors/NUSC. BPU=1/UPB; UPB=1/BPU.
Conversion Functions:
  The conversion factors UPB (or BPU) defined above are
    actually not constant but depend on the BER (or UCR) to be converted to UCR (or BER). These functions, like the variable they compute, are denoted simply by UPB(BER) or BPU(UCR). For example:
  UPB(BER): Conversion factor UPB as a function UPB (BER) of given BER.
  BPU(UCR): Conversion factor BPU as a function BPU (UCR) of a given UCR.
General Operation
  In general, operation of system 10 is as follows. Channel samples associated with a received signal, e.g., a received optical signal, are obtained and supplied to the LLR computation module 22. As is well known in LDPC decoding, the LLR computation module 22 generates so called channel LLRs for all bits. The variable node processors block 32 generates variable node (VN) messages from the channel LLRs. Initially, prior to the first iteration of the LDPC decoder 20, the VN messages are just the channel LLRs. The VN messages are supplied to the routing network 34. The check node processors block 36 generates a plurality of check node (CN) messages that are supplied to the routing network 34. Initially, prior to the first iteration of the LDPC decoder, the CN messages are all zero. The routing network 34 implements the connections between check nodes (rows) and variable nodes (columns) defined by the LDPC code's parity check matrix H. The routing network 34 can function in various ways and it need not physically and literally represent the parity check matrix H.

The variable node processors block 32 generates a-posteriori LLRs per bit (soft decoder outputs) that are supplied to the LLR hard decision logic 40. The LLR hard decision logic 40 generates decoded binary data c on the basis of the a-posteriori LLRs, where c is the output of the decoder. The parity check computation logic 38 computes a vector s of parity checks (called a syndrome) based on the parity check matrix H and the decoded binary data c, according to the equation s=H·c. When used for pre-FEC BER estimation, the syndrome s is computed also initially, prior to any decoding iteration, based only on channel LLRs.

The channel LLRs serve as unconditional reliability information. The a-posteriori LLRs serve as enhanced reliability information, conditioned on some given information (such as channel observations or code constraints).

In the control unit 50, the nonzero parity check bit count logic 70 computes a count of the number of nonzero parity check bits in a frame, also referred to as the number of unsatisfied checks per frame ($NUSC_{frame}$) or syndrome weight.

For LDPC decoder termination (iteration stop control), it suffices to determine if the syndrome (vector of parity check results) is identically zero after the most recent decoder iteration. In other words, it is determined if the syndrome weight ($NUSC_{frame}$=number of unsatisfied parity checks in a frame) is zero. Syndrome s and syndrome weight NUSC can be computed either from VN soft outputs or from CN data, as shown at reference numerals 90 and 92 of FIG. 1.

For pre-decoding (pre-FEC) BER estimation (also referred to as input BER), the (often non-zero) accumulated or averaged value of the initial syndrome weight ($NUSC_{frame}$) prior to any decoding iteration (which is based only on channel inputs) is of interest. The pre-decoding syndrome weight $NUSC_{frame}$ can be computed in different ways.

For example, for iteration stop control, parity checks can be computed after each iteration from the a-posteriori LLR outputs of the variable nodes. Hard decision of these LLRs yields the current value of the decoded binary data c and the syndrome is determined by computing all parity checks (described by check matrix H) based on c. The same computations can be executed prior to the first decoding iteration, when the variable node processors see all all-zero check node messages and LLR inputs from the channel.

Alternatively, the parity checks can be computed by a minor modification of the check nodes processors. Each check node represents a particular parity check (row of the parity check matrix H) and its main decoding task is to provide check node messages back to the connected variable node processors. Checking if the parity equation is fulfilled (i.e., computing parity check bits) is not really needed at this point of the decoding task, but it can be added easily by minor modifications. For example, a check node processor using the min-sum decoding algorithm uses signs and magnitudes of its input VN messages to compute its check node (output) messages, where all input signs except the sign of the corresponding input are multiplied. In one implementation, a product of signs corresponds to the XOR of sign bits. The overall parity check associated with a check node processor is computed as the XOR of the sign bits of all check node processor inputs. The partial sign products needed for computing the output messages can then be computed simply by XORing the sign bit to be excluded to the overall parity check result.

As explained above, syndrome s and syndrome weight $NUSC_{frame}$ can be computed either from the variable node messages (soft outputs) of the variable node processor block 32 or from the check node message data. In the case where check nodes are used to compute the parity checks, each parity check bit:=XOR of all VN message sign bits sent to the particular check node. In the case where the decoder output data bits are used, each parity check bit:=XOR of the data bits participating in the relevant parity check equation. Thus, as shown at reference numeral 80, parity check bits are supplied to the nonzero parity check bit count logic 70 either from the check node processors block 36 or from the parity check computation logic block 38. In conventional low density parity check decoding the iteration/stop control logic 76 may simply directly check for the syndrome to be identically zero, which requires only a logical OR of all parity check bits, but no counting arithmetic to actually compute the syndrome weight. It should be understood that the switch shown at reference numeral 80 is meant to be conceptual, and that only one of the two alternatives (90 or 92) would be implemented in a receiver system 10.

The BER estimation logic 74 uses the initial $NUSC_{frame}$, whereas the iteration/stop control logic 76 uses the $NUSC_{frame}$ after every iteration of the LDPC decoder. The accumulation logic 74 accumulates initial NUSCs for a given period of time, denoted as $T_e$ frames. The accumulated $NUSC_{frame}$ value after $T_e$ frames is denoted $NUSC_{acc}$.

As shown in FIG. 1 and described above, there are two paths 90 and 92, one of which is chosen at design time and implemented in a device, that may be used to compute the syndrome s, which is supplied as input to the nonzero parity check bit count logic 70. Either of these paths may be used. The first path 90 is taken from the variable node processors block 32, the LLR hard decision logic 40, and the parity check computation logic 38. This first path 90 is described further hereinafter in connection with FIG. 2. The second path 92 uses output from the check node processors block 36, and is described further hereinafter in connection with FIG. 3.

Figure 2:
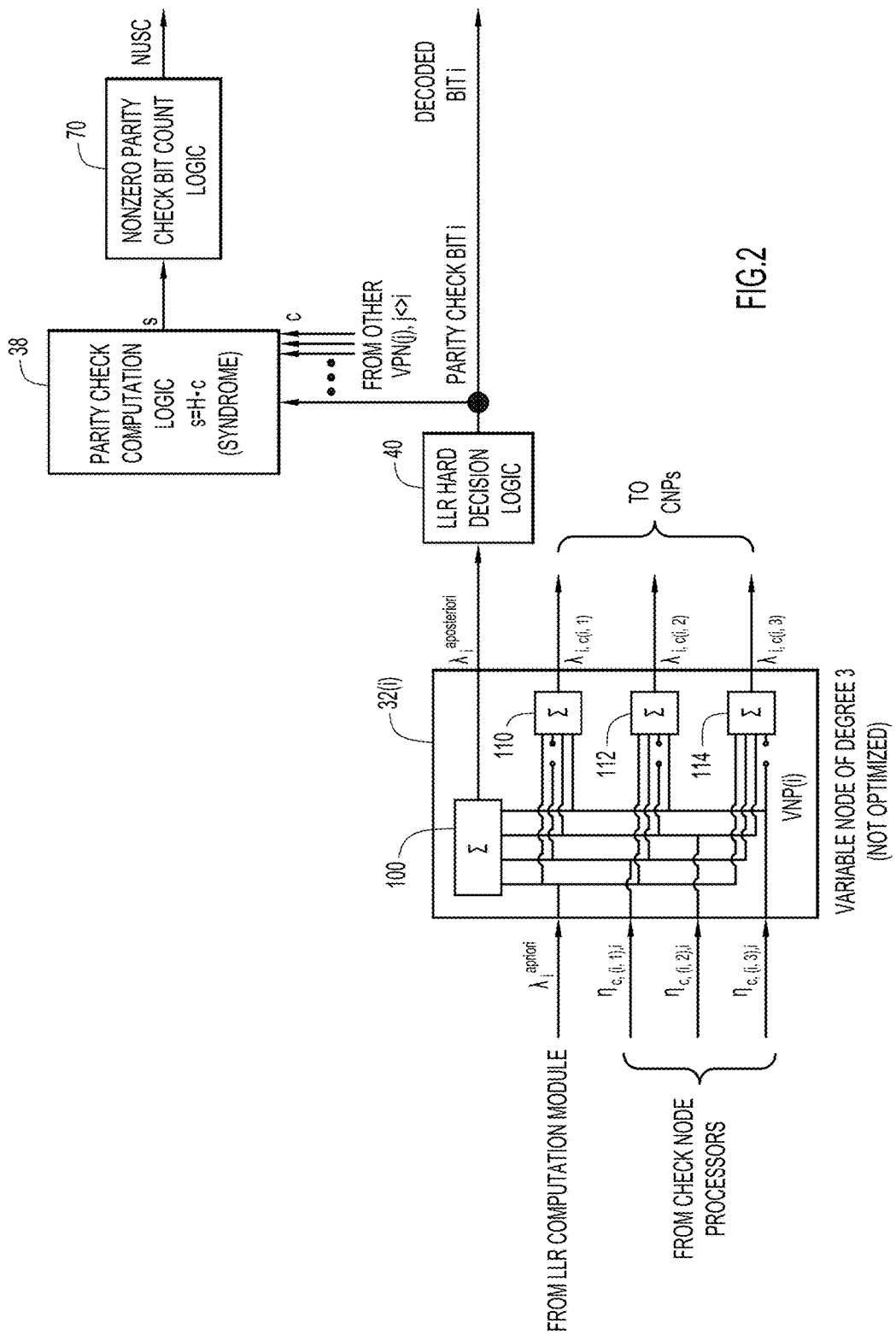
FIG. 2 is a block diagram of a variable node processor in the low density parity check decoder, and illustrating one way of obtaining parity check bits for purposes of estimating operational characteristics of the low density parity check decoder, according to an example embodiment.

Referring now to FIG. 2, an example is shown of a scheme to compute the syndrome s using output from the variable node processors block 32, i.e., path 90 in FIG. 1. FIG. 2 shows, as an example, a single (i.e., the i'th) variable node processor 32(i), also denoted VNP(i), representing the i'th bit of the code word. One variable node represents a single bit in a low density parity check code. In this example, the variable node is of degree $d_v=3$. The variable node processor 32(i) receives as input channel LLRs from the LLR computation module 20 (FIG. 1). The channel LLRs are denoted $\lambda_i^{apriori}$. The variable node processor 32(i) also receives as input check node messages from the check node processors. These check node messages are denoted $\eta_{C(i,1),i}$, $\eta_{C(i,2),i}$, and $\eta_{C(i,3),i}$, where C(i,j) identifies the check node of the j'th parity check in which variable node i participates.

Initially, all of the check node message inputs are zero. The variable node processor 32(i) includes summation blocks 100, 110, 112 and 114. The outputs of the variable node processor 32(i) are variable node messages $\lambda_{i,C(i,1)}$, $\lambda_{i,C(i,2)}$ and $\lambda_{i,C(i,3)}$ as well as the a-posteriori message $\lambda_i^{aposteriori}$, which is supplied to the LLR hard decision logic 40.

At the first decoding iteration, since all check node messages are initially zero, the summation performed by summation block 100 will result only in the channel LLRs $\lambda_i^{apriori}$. The LLR hard decision logic 40 at this point is based only on the channel information, the channel LLRs $\lambda_i^{apriori}$. Thus, the parity check computation logic 38 effectively computes the initial syndrome s based only on the channel LLRs input to the LDPC decoder. In this example, the syndrome s is supplied to the nonzero parity check bit count logic 70 to compute the NUSC prior to decoding. Again, this is one way to compute NUSC for purposes of BER estimation. This path is also useful after the first iteration, e.g. for purposes of iteration/stop control or for decoder performance monitoring.

Figure 3:
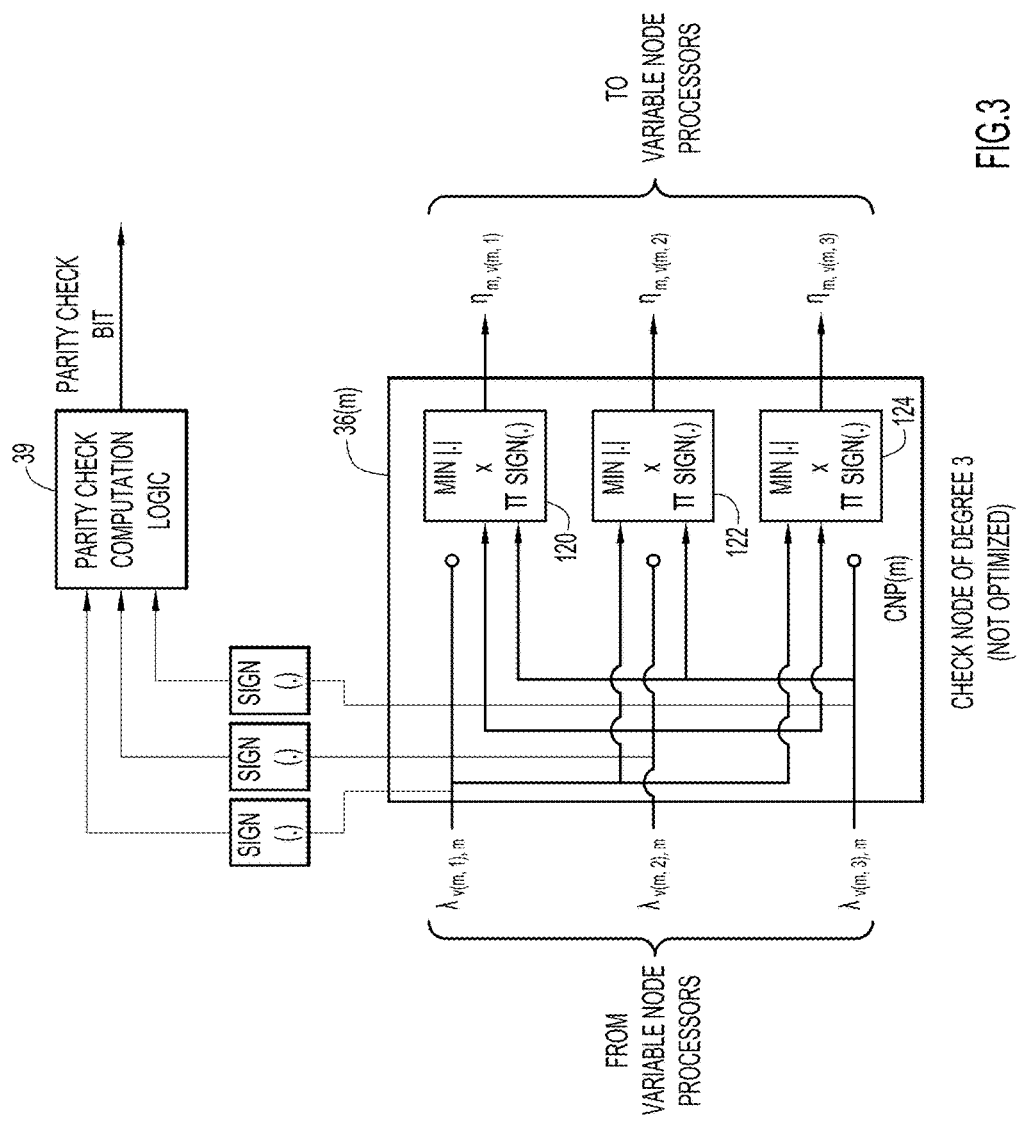
FIG. 3 is a block diagram of a check node processor in the low density parity check decoder, and illustrating another way of obtaining parity check bits for purposes of estimating operational characteristics of the low density parity check decoder, according to an example embodiment.

Reference is now made to FIG. 3 to illustrate the modification of a check node processor in order to compute the parity check bit (for computing $NUSC_{frame}$) if the second path 92 (FIG. 1) is used, according to one embodiment. FIG. 3 illustrates a single (i.e., the m'th) check node processor 36(m) (also denoted CNP(m)), for simplicity, of degree $d_c=3$, as an example. This diagram is a mathematical view of one check node processor using a product of signs implementation (XOR of sign bits). The check node processor 36(m) receives as input variable node messages $\lambda_{V(m,1),m}$, $\lambda_{V(m,2),m}$ and $\lambda_{V(m,3),m}$, where V(m,k) identifies the k'th variable node participating in the check computed by check node m. Initially, all the variable node message inputs carry only channel LLRs.

The check node processor 36(m) includes three computation blocks 120, 122 and 124 that perform a minimum of magnitudes times a product of sign bits operation (excluding the "corresponding" input). The outputs of these operational blocks are $\eta_{m,V(m,1)}$, $\eta_{m,V(m,2)}$, and $\eta_{m,V(m,3)}$.

FIG. 3 shows that the variable node messages $\lambda_{V(m,1),m}$, $\lambda_{V(m,2),m}$ and $\lambda_{V(m,3),m}$ are also supplied to the parity check computation logic 39. The parity check computation logic 39 computes the syndrome s from the sign bits of all the inputs to the check node processor 36(m), i.e. a product of all of the signs. In one form, this is computed by an XOR of all sign bits "0" or "1", where "0" means a negative (−) sign and "1" means a positive (+) sign. Thus, if the second path 92 (FIG. 1) is used to compute the parity check, then parity check computation logic 39 is provided to compute the parity check bit by an XOR of all sign bits of the incoming variable node messages. The output of parity check computation logic 39 is coupled to the nonzero parity check bit count logic 70, similar to the arrangement shown in FIG. 2.

To reiterate, the nonzero parity check bit count logic 70 (shown in FIG. 1) adds all parity check bits to compute $NUSC_{frame}$. For purposes of the BER estimation techniques presented herein, the computation of the parity check bits prior to the first LDPC decoder iteration is relevant, when the incoming messages from the variable node processors carry only the channel LLRs and prior to any operations of the check node processors in the LDPC decoder. This parity check computations can be made for every iteration, but for purposes of pre-FEC BER estimation it is only the initial parity check computation (leading to the NUSC computation) based on the channel LLRs only that is of interest.

Moreover, this parity check computation can be made either by the first path 90 described in FIG. 2 or by the second path 92 described in FIG. 3.

Figure 4:
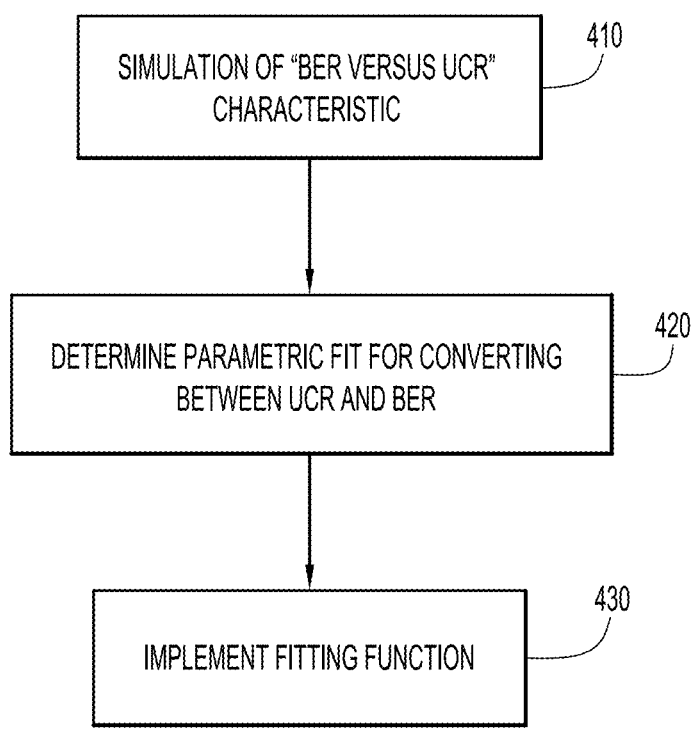
FIG. 4 is a flow chart generally depicting operations performed during a design phase to generate a mathematical function used to convert between unsatisfied parity checks and input bit error ratio of the low density parity check decoder, according to an example embodiment.

Reference is now made to FIG. 4. In order to perform in-service pre-FEC BER estimation, several operations are performed during the design (offline) phase in order to obtain the necessary data to generate fitting functions that can be applied to measured UCRs (NUSCs) or BERs. FIG. 4 illustrates a flowchart 400 for the steps performed during the design phase. At 410, simulations are run for the BER versus UCR relationship. At 420, a parametric fit is determined for a function that converts between UCR and BER. At 430, the fitting function(s) determined at 420 is (are) implemented.

In the simulations step 410, for a set of error probabilities p (e.g. $p = k \cdot 10^{-i}$, $k \in \{1, 2, 5\}$, $i \in \{1, 2, \ldots, 6\}$), the following operations are performed. A random codeword c (or simply assume c=zero codeword transmitted) is generated. A random error vector e for given error probability p is generated, and r=c+e. A syndrome s (alias vector of parity checks) of received signal r with a code check matrix H is computed as $s = H \cdot r$. A syndrome weight is computed, $w(s) =: NUSC_{frame}$ by counting all non-zero bits in s. The syndrome weight w(s) is averaged over many random samples r, obtaining expectation $E[NUSC_{frame}]$ for given error probability p, which is divided by the code word length N to obtain $UCR(p) = E[NUSC_{frame}]/N$. Note that instead of the simulations with H acting on random error code word vectors, one can also run an existing channel model and decoder simulator to determine the empirical UCR(p) relationship.

Reference is made to FIG. 5 for a further description of the simulation step 410. FIG. 5 illustrates simulation results generated with error probability p in a Monte Carlo simulation. This error probability p is shown in column 502. For a given error probability p (which serves as an alias for BER), UCR or UPB=UCR/BER is computed by averaging many syndrome weight results over many random error vectors generated with error probability p in a Monte Carlo simulation. The UPB derived data is shown in column 504. Columns 506 and 508, BPU and UCR, respectively, can be derived from UPB.

The parametric function fitting operation 420 is now further described. An appropriate parametric function is determined in order to convert between BER and UCR based on the simulation results. Characteristics may be obtained for:

UCR(BER) a monotonic function for p not too high
BER(UCR) inverse functional relation by swapping coordinates
BPU(UCR):=BER(UCR)/UCR UCR to BER conversion factor
UPB(BER):=UCR(BER)/BER, BER to UCR conversion factor A parametric fit is determined for the desired conversion functions, e.g.:

BPU(UCR) or BER(UCR)
UPB(BER) or UCR(BER)

Figure 6:
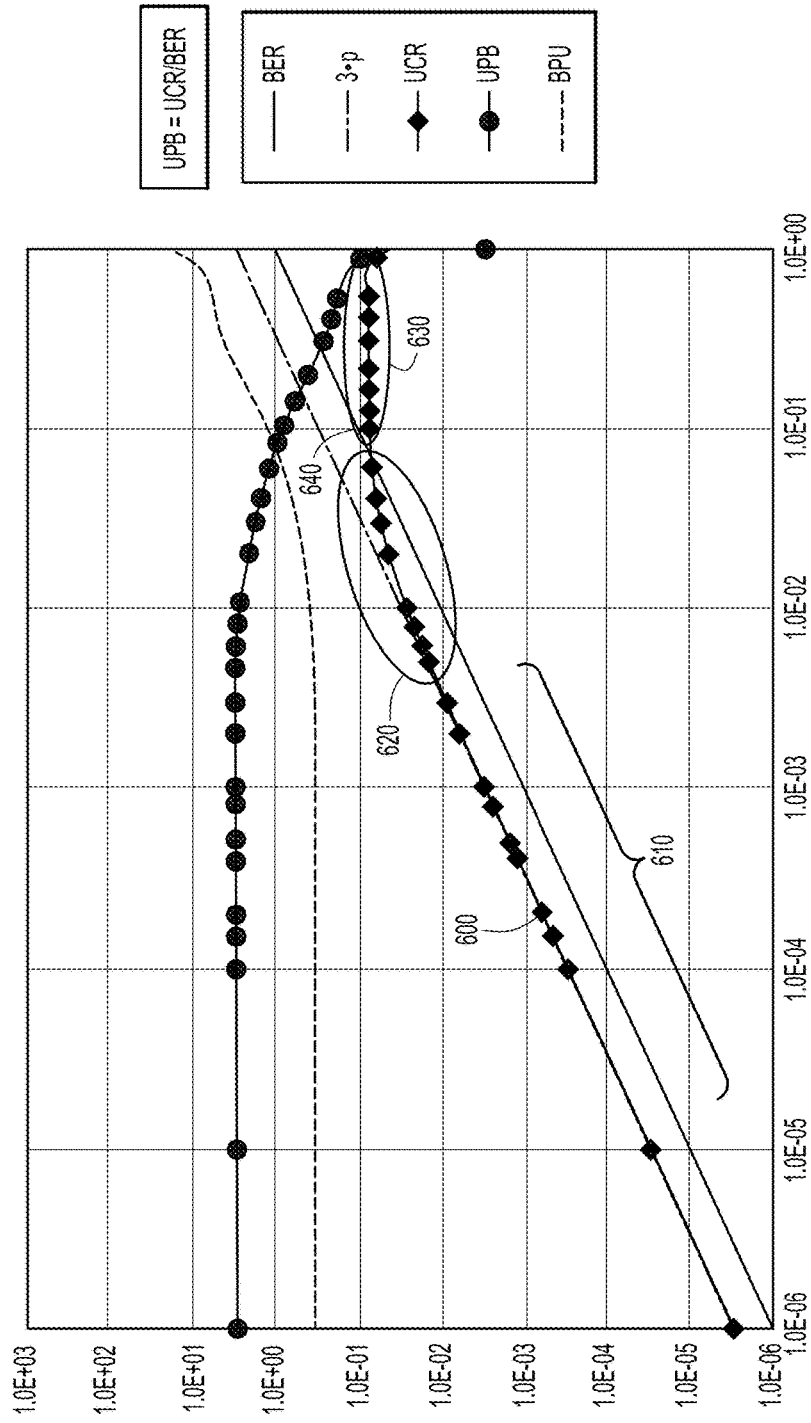
FIG. 6 is a plot of data obtained from simulations for unsatisfied parity check ratio versus bit error probabilities, from which a fitting function is generated for converting from bit error ratio to unsatisfied parity checks, according to an example embodiment.

FIG. 6 illustrates how a parametric fit is obtained for a BER to UCR conversion. The average UCR for given p is determined by simulation and plotted against the value of the error probability p, as shown at reference numeral 600. By drawing the simulated quantities as a function of the error probability p (alias of BER), a parametric fit can be determined using standard curve fitting techniques. As shown at reference numeral 610, for low BER, UCR is proportional to BER. At 620, UCR saturates, and at 630, the curve is too flat. As shown at 640, experimentally obtained UCR(BER) is strictly monotonic with sufficient slope for p up to approximately 0.1, and thus, in these circumstances, UCR(BER) is invertible with low variance.

Converting BER to UCR (for UCR Threshold Setting)

For online UCR threshold setting (useful for efficient alarming of BER threshold crossing), a function UPB(BER) or UCR(BER), that converts a given BER threshold to a conversion factor UPB or directly to UCR, is generated. Simulations like that shown in FIG. 4 are used to generate an estimate of this function, e.g. UPB(BER), by computing average UCR or UPB for several given BER levels. For example, measuring UCR over 2000 frames (approximately 1 ms for an example code) for given BER is sufficient for excellent UCR or UPB estimation accuracy. Then, a simple analytical approximation (parametric fit) of UPB(BER) or UCR(BER) (for BER threshold to UCR threshold conversion) is obtained.

There are at least two practical options for fitting an estimator to the data. First, UCR(BER) is fit directly. Second, UPB(BER) is fit to compute UCR as UCR=UPB(BER)·BER. These two fitting estimations are equivalent, but the functional forms of the parametric fit are visually suggested differently. Thus, in principle it is possible to fit UCR directly as a function of BER. In practice, fitting a conversion factor UPB is better because it factors out the asymptotically constant conversion factor at low BER or UCR. When fitting for computed NUSC thresholds, underestimation is preferred.

The following are example fitting functions for one example LDPC code.

$$UCR = UPB(BER) \cdot BER$$

$$UPB(BER) := \frac{f}{1 + (g \cdot BER)^h}$$

$$UCR = \frac{f}{1 + (g \cdot BER)^h} \cdot BER$$

where f, g and h are appropriate parametric values.

Converting Measured UCR to BER (BER Estimation)

Figure 7:
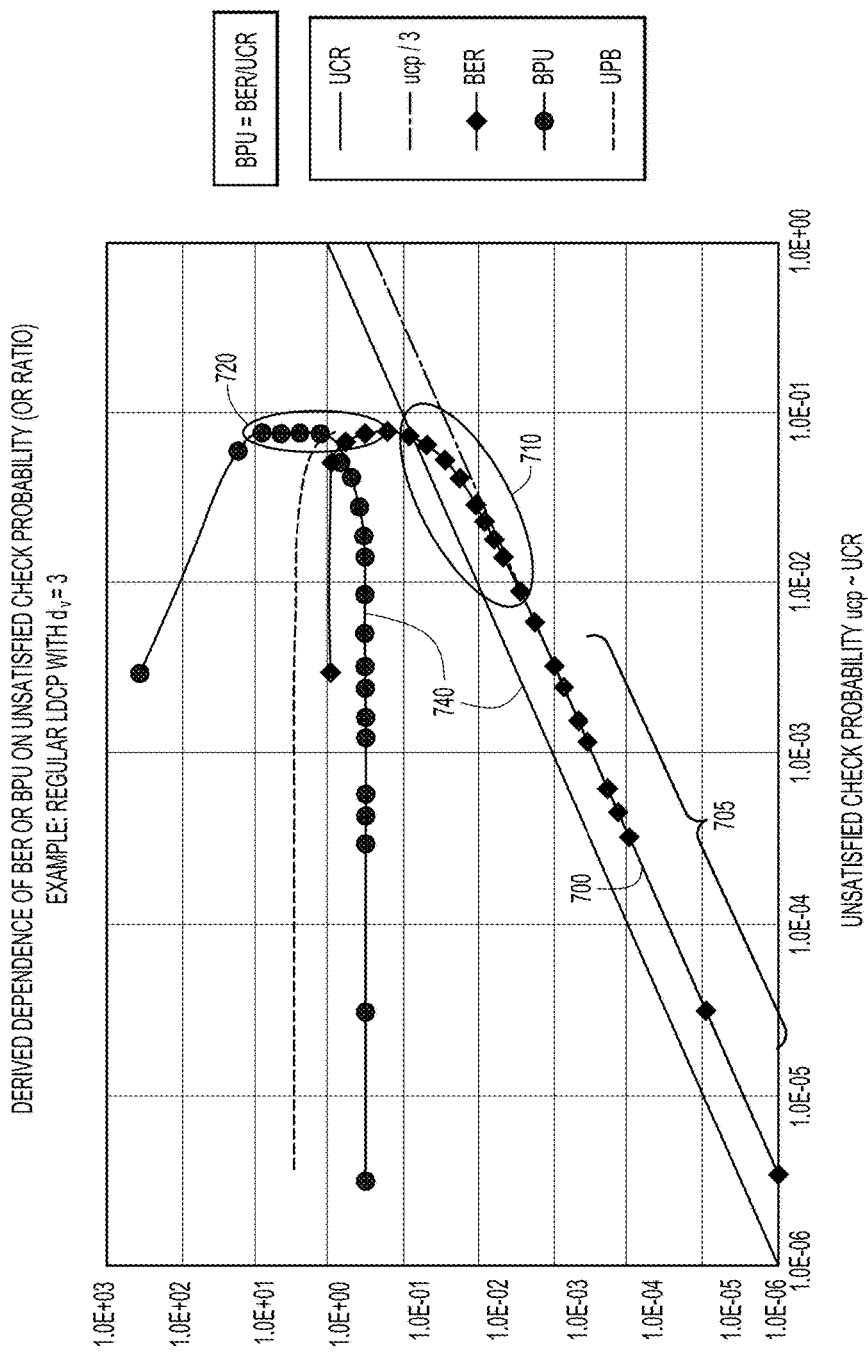
FIG. 7 is a plot of data obtained from simulations for bit error ratio versus unsatisfied check probabilities, from which a fitting function is generated for converting measured unsatisfied parity checks to a bit error ratio estimation, according to an example embodiment.

FIG. 7 illustrates how a parametric fit is obtained for a UCR to BER conversion. Plotting the simulated quantities of BER as a function of UCR allows for the generation of fitting functions that help to convert a measured UCR into a BER estimation. In FIG. 7, a plot is made of UCR against the value of error probability p, as shown at reference numeral 700. Using the average UCR simulation result as the independent variable, the other variables can be visualized as function of average UCR, and then a function is fit to the data. As shown at 705, for low UCR, BER is well proportional to UCR, for higher UCR, at 710, a nonlinear conversion function is needed and at 720, the curve is too steep to be useful. Moreover, as shown at 740, a parametric fit either for BPU(UCR) or BER(UCR) can be found.

There are two practical options for fitting an estimator to the data. One option is to compute BER(UCR) directly. Another option is to fit BPU(UCR) and then compute BER as BER=BPU(UCR)·UCR.

For online (in-service) BER estimation, a function BPU(UCR) or BER(UCR) is needed to convert a measured UCR to a BPU conversion factor or directly to a BER estimate. Using the simulation data plotted over UCR, an empirical version of each of these functions is available and can be fitted. Again, in principle, it is possible to fit BER(UCR) directly from the simulated UCR(BER) relation. In practice, a conversion factor BPU(UCR) is fitted instead because it factors out the asymptotically constant conversion factor at low BER or UCR. In contrast to the case of UCR estimation described above, when fitting for computed BER, BER overestimation is preferred.

The following are example fitting functions for the same example LDPC code.

$$BER = BPU(BER) \cdot UCR$$

$$BPU(UCR) := [a \cdot UCR + b] + \left[ \frac{c}{\sqrt[\gamma]{k \cdot |UCR + d|}} \right]$$

$$BER = [a \cdot UCR^2 + b \cdot UCR] + \left[ \frac{c \cdot UCR}{\sqrt[\gamma]{k \cdot |UCR + d|}} \right]$$

where a, b, c, d and k are appropriate parametric values.

Furthermore, it is possible to directly fit the relations UCR(p) and its inverse BER(UCR). Fitting conversion factors (the bit errors per unsatisfied check alias BPU(BER) and the unsatisfied checks per bit error alias UPB(UCR)) is somewhat closer to the "derivation" of the method (predicting that UPB(p) will be constant and equal to the average VN degree for low error probability p).

There is no essential difference, since the quantities are related by:

BPU(UCR)=BER(UCR)/UCR

UPB(BER)=UCR(BER)/BER

In the parametric function implementation step 430 of FIG. 4, the BER estimation from measured UCR, e.g. BER(UCR)=BPU(UCR)·UCR, is computed. Alternatively, or additionally, the $UCR_{acc}$ threshold computation is made given a desired BER threshold.

In-Service Pre-FEC BER Monitoring

Figure 8:
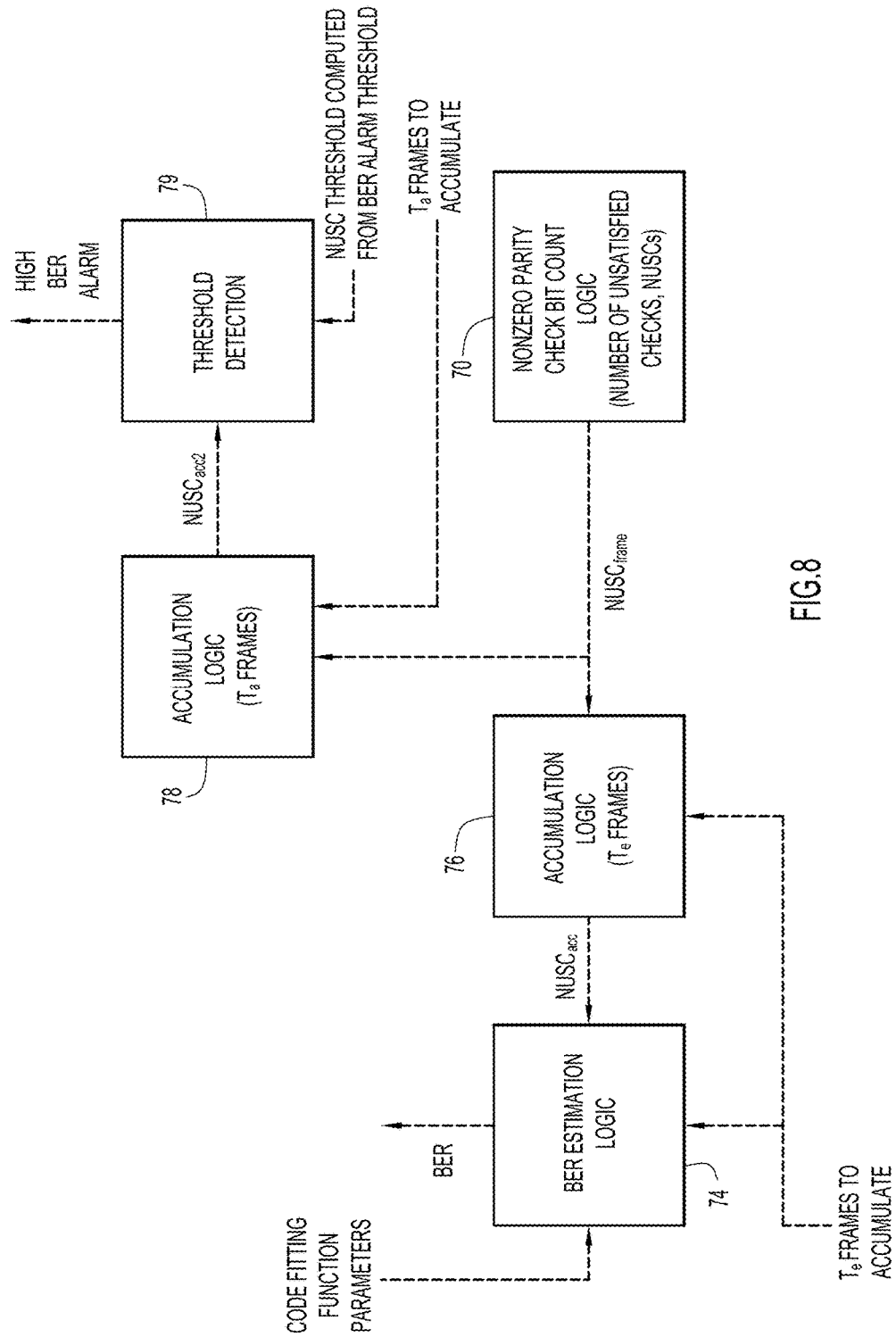
FIG. 8 is a flow diagram depicting uses of accumulated unsatisfied parity checks for computing an estimated bit error ratio and for generating an alarm/alert when the number of unsatisfied parity checks exceeds a threshold, according to an example embodiment.

Reference is now made to FIG. 8. FIG. 8 illustrates how the BER techniques may be used at runtime for performance monitoring, and also for alarming or signaling purposes. For performance monitoring, periodically, a $NUSC_{frame}$ is accumulated over $T_e$ frames by the accumulation logic 76 to produce a $NUSC_{acc}$ value. Other forms of averaging, such as a moving average filter, may also be used. The BER estimation logic 74 is then invoked to compute a BER estimation using the techniques described above in connection with FIGS. 1-7. Using the parametric fitting function, UCR is first computed and then a fitting function BPU(UCR) is used to compute a BER estimate:

$UCR=NUSC_{acc}/(T_e \cdot N)$

BER=BPU(UCR)·UCR

Alternatively, BER is computed directly from $NUSC_{acc}$ according to the computation: $BER=BPU(NUSC_{acc})/(T_e \cdot N)$.

FIG. 8 also shows that code fitting function parameters are supplied as input to the BER estimation logic 74 which uses those parameters to compute the estimated BER on the basis of $NUSC_{acc}$.

In-Service Pre-FEC BER Threshold Crossing Alarm

Accumulation logic 78 is provided to accumulate $NUSC_{frame}$ over $T_a$ frames to independently produce a second NUSC accumulated value, called $NUSC_{acc2}$. The threshold detection logic 79 then compares the $NUSC_{acc2}$ value with a threshold. This is more efficient than first computing a BER estimate and then comparing against a BER threshold. The accumulation logic 78 and threshold detection logic 79 may be implemented by instructions stored in memory 54 and executed by processor 52, shown in FIG. 1. For alarming or signaling purposes, the following is performed. During provisioning or configuration/set-up of the system 10, the BER threshold is converted to a NUSC threshold according to the computation: $NUSC_{threshold}:=T_a \cdot N \cdot NPU(BER)$.

Periodically, $NUSC_{acc2}$ is compared against the $NUSC_{threshold}$, for threshold crossing detection. Commonly used detector refinements like hysteresis can be applied. The period of time $T_a$ may be different than the period of time $T_e$. This latter application is useful for fast proactive protection signaling such that when the BER is above a threshold (or the NUSCs are exceeding a threshold), a protection mechanism such as fast reroute (FRR), link restoration, etc., is invoked.

Data representing the mathematical functions used for computations made by the BER estimation logic 74, and for converting between UCR and BER (and various other conversions described herein) may be stored in memory 54, and is executed by the processor 52.

Reference is now made to FIG. 9. FIG. 9 illustrates a flow chart that generally depicts the operations of a method 900 according to the embodiments presented herein. At 910, in a device that receives signals over a communication medium and uses a low density parity check decoder to decode data in the signals, a number of unsatisfied parity checks are counted prior to a first decoding iteration of the low density parity check decoder on a basis of log likelihood ratios (or equivalent bit reliability or soft information) computed from the signals. In other words, log likelihood ratios are just one form of bit reliability or soft information. At 920, an operational characteristic of the low density parity check decoder is computed based on the accumulated number of unsatisfied parity checks. As explained above, data may be stored in the device that represents a mathematical function used for computing the operational characteristic of the low density parity check decoder from the accumulated number of unsatisfied parity checks. The data representing the function may be generated from simulations run for a low density parity check code across a range of error probabilities in order to determine bit error ratio versus unsatisfied parity check characteristics of the LDPC decoder. The mathematical function used for computing the operational characteristic from the accumulated unsatisfied parity checks may be in the form of, for example, a fixed function for a particular LDPC code, a parametric function described by stored parameters, or a look-up table (stored in memory 54 of FIG. 1).

To summarize, a pre-FEC bit error ratio estimation method is presented herein that exploits LDPC code constraints (parity checks) to provide fast (within milliseconds), unbiased (accurate), in-service (non-intrusive, simultaneous with post-FEC bit error ratio measurement), low-variance (reliable) estimation of the input bit error ratio (input BER) of an LDPC decoder, based on the soft inputs provided to the LDPC decoder. The iterative LDPC decoder counts parity check violations prior to the first iteration and estimates from that the number of errors that would remain when it would not decode, i.e. it determines the "input bit error ratio" to the LDPC decoder. Note that, strictly speaking, at the input of the LDPC decoder there is soft data (e.g., LLRs), so there are no "bit errors" committed yet. However, if the LDPC decoder would be (conceptually) replaced with an LLR slicer, or if the LDPC decoder would be bypassed, the bit errors at the output of the LLR slicer (or at the output of the decoder bypass) would be the "pre-FEC bit errors".

These techniques have many advantages. For example, an unbiased low-variance estimate of BER can be obtained at good signal conditions (where signal degradation needs to be detected). The estimator variance is not higher than that of a true BER measurement based on known data (out-of-service pseudo-random binary sequence based error counting). That is, the required measurement time is inversely proportional to the BER to be detected. These estimation techniques operate independently of decoder design and operation, based solely on forward error correction input data (unlike, for example, the corrected bits and uncorrectable blocks contribution in Reed-Solomon decoders).

Furthermore, the parity check function is already part of the decoder. Therefore, the only additional hardware needed is for adding (rather than just computing the logical OR of) the single parity check results. This summation of many binary terms can be delayed (in a pipeline) arbitrarily and is not time-critical.

Furthermore, unlike existing methods for non-algebraic decoding, this approach avoids time consuming auxiliary decision processes (eye monitoring) or second order statistics of decision variables (noise variance), which are fast and accurate only in slowly time-variant high noise situations. Quite the contrary, the estimation techniques presented herein are particularly fast and accurate for low input BER (where signal degradation needs to be detected). These bit error estimation techniques work also well above the FEC correction limit (e.g., for characterization and lab use). At the cost of higher variance, estimates of a single code frame (or a few code frames) are possible. Computing the syndrome weight at each iteration provides a useful internal performance monitor for the decoder behavior in unknown communication channel/medium conditions.

To summarize, a method is provided comprising: in a device that receives signals over a communication medium and uses a low density parity check decoder to decode data in the signals, counting a number of unsatisfied parity checks prior to a first decoding iteration of the low density parity check decoder on a basis of log likelihood ratios computed from the signals; and computing an operational characteristic of the low density parity check decoder based on the accumulated number of unsatisfied parity checks Similarly, an apparatus is provided comprising a low density parity check decoder that decodes data contained in signals received over a communication medium; and a controller (control unit) coupled to the low density parity check decoder, wherein the controller computes an operational characteristic of the low density parity check decoder based on an accumulated number of unsatisfied parity checks of the low density parity check decoder prior to a first decoding iteration on a basis of log likelihood ratios computed from the signals.

Further still, a processor readable storage media is provided that is encoded with instructions that, when executed by a processor, cause the processor to: in a device that receives signals over a communication medium and uses a low density parity check decoder to decode data in the signals, count a number of unsatisfied parity checks prior to a first decoding iteration of the low density parity check decoder on a basis of log likelihood ratios computed from the signals; and compute an operational characteristic of the low density parity check decoder based on an accumulated number of unsatisfied parity checks.

The above description is intended by way of example only. Various modifications and structural changes may be made therein without departing from the scope of the concepts described herein and within the scope and range of equivalents of the claims.

What is claimed is:

1. A method comprising:
   in a device that receives a signal over a communication medium and uses a low density parity check decoder to decode data in the signal, the low density parity check decoder including variable node processors and check node processors coupled to the variable node processors via a routing network defined by a parity check matrix, wherein the data consists of frames and each frame is a codeword to be decoded, counting a number of unsatisfied parity checks based on sign bits of variable node messages generated by the variable node processors for each frame of a plurality of frames prior to a first decoding iteration of the low density parity check decoder on a basis of channel log likelihood ratios computed by the low density parity check decoder from the plurality of frames of the signal;
   accumulating the number of unsatisfied parity checks over the plurality of frames;
   computing a pre-forward error correction bit error rate estimation of the low density parity check decoder based on the number of unsatisfied parity checks accumulated over the plurality of frames, the computing being performed prior to the first decoding iteration when the variable node messages from the variable node processors to the check node processors carry only the channel log likelihood ratios and check node messages generated by the check node processors are all zero;
   comparing the number of unsatisfied parity checks accumulated over the plurality of frames with a threshold of unsatisfied parity checks, the threshold of unsatisfied parity checks being derived from a bit error rate threshold; and
   generating a proactive protection alert to invoke a protection mechanism including a fast reroute or link restoration function for a communication link in the communication medium when the threshold of unsatisfied parity checks is met.

2. The method of claim 1, further comprising computing the threshold of unsatisfied parity checks from a bit error rate threshold.

3. The method of claim 1, wherein counting is based on parity check bits generated as a result of parity check operations performed by the low density parity check decoder.

4. The method of claim 3, further comprising generating the parity check bits based on an XOR operation of all sign bits of variable node messages produced by the variable node processors as input to the check node processors of the low density parity check decoder.

5. The method of claim 1, wherein computing the pre-forward error correction bit error rate estimation is based on data representing a mathematical function relating the number of unsatisfied parity checks accumulated over the plurality of frames to bit error rate.

6. The method of claim 5, further comprising generating the data representing the mathematical function from simulations run for a low density parity check code across a range of error probabilities in order to determine bit error ratio versus unsatisfied parity check characteristics of the low density parity check decoder.

7. An apparatus comprising:
a low density parity check decoder that decodes data contained in a signal received over a communication medium, the low density parity check decoder including variable node processors and check node processors coupled to the variable node processors via a routing network defined by a parity check matrix, wherein the data consists of frames and each frame is a codeword to be decoded; and
a controller coupled to the low density parity check decoder, wherein the controller is configured to:
count a number of unsatisfied parity checks based on sign bits of variable node messages generated by the variable node processors for each frame of a plurality of frames prior to a first decoding iteration on a basis of channel log likelihood ratios computed from the frames;
accumulate the number of unsatisfied parity checks over the plurality of frames;
compute a pre-forward error correction bit error rate estimation of the low density parity check decoder based on the number of unsatisfied parity checks accumulated over the plurality of frames, the pre-forward error correction bit error rate estimation being computed prior to the first decoding iteration when the variable node messages from the variable node processors to the check node processors carry only the channel log likelihood ratios and check node messages generated by the check node processors are all zero;
compare the number of unsatisfied parity checks accumulated over the plurality of frames with a threshold of unsatisfied parity checks, the threshold of unsatisfied parity checks being derived from a bit error rate threshold; and
generate a proactive protection alert to invoke a protection mechanism including a fast reroute or link restoration function for a communication link in the communication medium when the threshold of unsatisfied parity checks is met.

8. The apparatus of claim 7, wherein the controller is configured to count based on parity check bits generated as a result of parity check operations performed by the low density parity check decoder.

9. The apparatus of claim 7, wherein the controller is configured to compute the pre-forward error correction bit error rate estimation based on data representing a mathematical function relating the accumulated number of unsatisfied parity checks to bit error rate.

10. A non-transitory processor readable storage media encoded with instructions that, when executed by a processor, cause the processor to:
in a device that receives a signal over a communication medium and uses a low density parity check decoder to decode data in the signal, the low density parity check decoder including variable node processors and check node processors coupled to the variable node processors via a routing network defined by a parity check matrix, wherein the data consists of frames and each frame is a codeword to be decoded, count a number of unsatisfied parity checks based on sign bits of variable node messages generated by the variable node processors for each frame of a plurality of frames prior to a first decoding iteration of the low density parity check decoder on a basis of channel log likelihood ratios computed from the frames;
accumulate the number of unsatisfied parity checks over the plurality of frames;
compute a pre-forward error correction bit error rate estimation of the low density parity check decoder based on the number of unsatisfied parity checks accumulated over the plurality of frames, the pre-forward error correction bit error rate estimation being computed prior to the first decoding iteration when the variable node messages from the variable node processors to the check node processors carry only the channel log likelihood ratios and check node messages generated by the check node processors are all zero;
compare the number of unsatisfied parity checks accumulated over the plurality of frames with a threshold of unsatisfied parity checks, the threshold of unsatisfied parity checks being derived from a bit error rate threshold; and
generate a proactive protection alert to invoke a protection mechanism including a fast reroute or link restoration function for a communication link in the communication medium when the threshold of unsatisfied parity checks is met.

11. The non-transitory processor readable storage media of claim 10, further comprising instructions that cause the processor to compute the pre-forward error correction bit error rate estimation based on data representing a mathematical function used for relating the number of unsatisfied parity checks accumulated over the plurality of frames to bit error rate.

12. The method of claim 1, wherein computing comprises computing the pre-forward error correction bit error rate estimation of the low density parity check decoder during operation of the low density parity check decoder while a data transmission to the device that includes the low density parity check decoder is occurring, without disturbing that transmission and without knowledge about the transmitted data payload.

13. The apparatus of claim 7, wherein the processor is further configured to compute the threshold of unsatisfied parity checks from a bit error rate threshold.

14. The apparatus of claim 8, wherein the parity check bits are computed based on an XOR operation of all sign bits of variable node messages produced by the variable node processors as input to the check node processors of the low density parity check decoder.

15. The apparatus of claim 9, wherein the data representing the mathematical function is obtained from simulations run for a low density parity check code across a range of error probabilities in order to determine bit error ratio versus unsatisfied parity check characteristics of the low density parity check decoder.

16. The non-transitory computer readable storage media of claim 10, further comprising instructions that cause the processor to compute the threshold of unsatisfied parity checks from a bit error rate threshold.

17. The non-transitory computer readable storage media of claim 10, further comprising instructions to compute the parity check bits based on an XOR operation of all sign bits of variable node messages produced by the variable node processors as input to the check node processors of the low density parity check decoder.

18. The non-transitory computer readable storage media of claim 11, wherein the data representing the mathematical function is obtained from simulations run for a low density parity check code across a range of error probabilities in order to determine bit error ratio versus unsatisfied parity check characteristics of the low density parity check decoder.

\* \* \* \* \*